(12) United States Patent
Gaboriau et al.

(10) Patent No.: US 6,538,590 B1
(45) Date of Patent: Mar. 25, 2003

(54) TRANSIENT NOISE REDUCTION CIRCUITS, SYSTEMS AND METHODS IN POWER DIGITAL-TO-ANALOG CONVERTERS

(75) Inventors: Johann Guy Gaboriau, Austin, TX (US); Eric Walburger, Austin, TX (US); John Laurence Melanson, Austin, TX (US); Xiaofan Fei, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 25 days.

(21) Appl. No.: 09/825,080

(22) Filed: Apr. 2, 2001

(51) Int. Cl.[7] .................................................. H03M 1/66
(52) U.S. Cl. .......................... 341/152; 327/384; 330/265
(58) Field of Search .................... 341/152; 327/391, 327/384; 326/58; 330/264, 265, 332

(56) References Cited

U.S. PATENT DOCUMENTS

| | | | | |
|---|---|---|---|---|
| 5,043,729 A | * | 8/1991 | Fujimoto | 341/152 |
| 5,371,420 A | * | 12/1994 | Nakao | 326/27 |
| 5,877,647 A | * | 3/1999 | Vajapey et al. | 327/391 |
| 6,225,844 B1 | * | 5/2001 | Fujiwara | 327/170 |

* cited by examiner

*Primary Examiner*—Howard L. Williams
(74) *Attorney, Agent, or Firm*—Barry S. Newberger; Winstead Sechrest & Minick P.C.; Peter Rutkowski

(57) ABSTRACT

A system for suppressing transient noise in switched-mode amplifier systems is disclosed. An amplifier, for amplifying a signal from a digital signal source includes a first complementary metal oxide semiconductor field effect transistor (MOSFET) pair. A common node of the pair is serially coupled to an output node of the amplifier by a resistor. The first MOSFET pair is configured to drive a ramp on the output node of the amplifier.

35 Claims, 4 Drawing Sheets

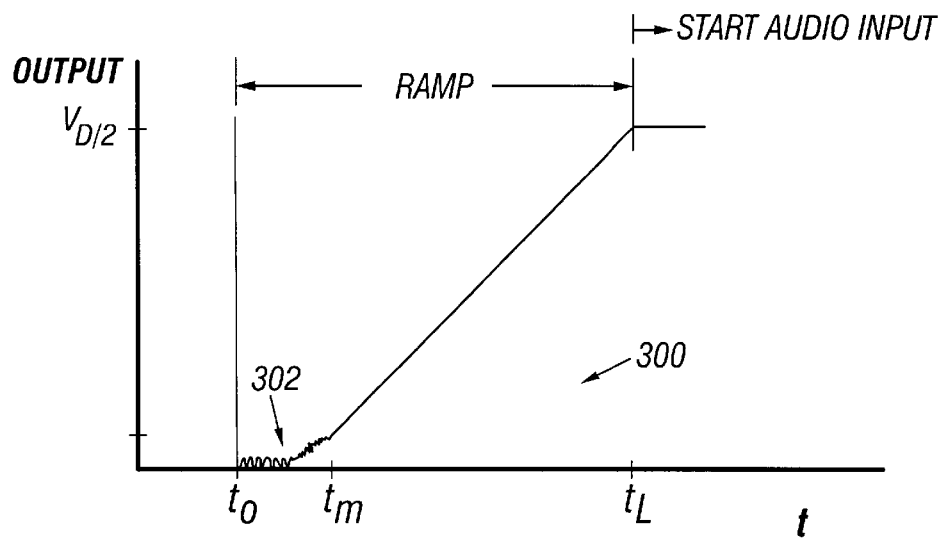
FIG. 3.1
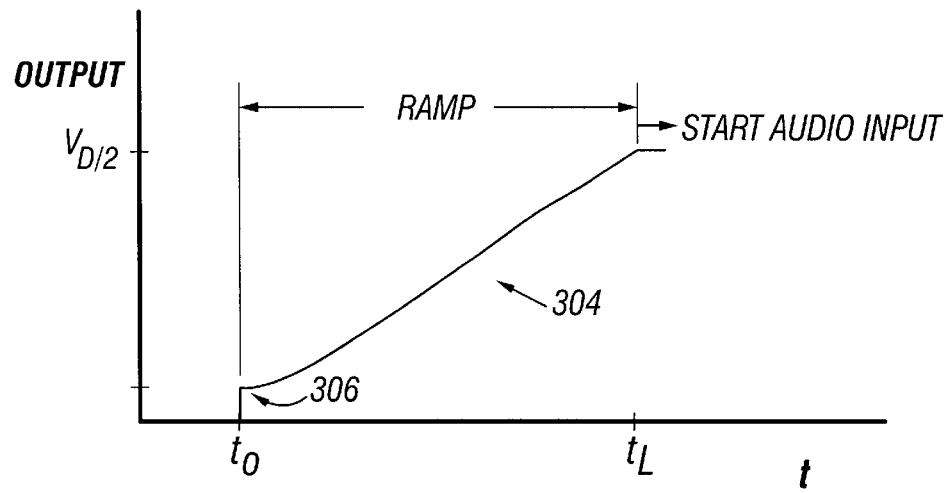
FIG. 3.2
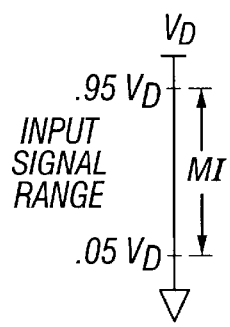
FIG. 3.3

TRANSIENT NOISE REDUCTION CIRCUITS, SYSTEMS AND METHODS IN POWER DIGITAL-TO-ANALOG CONVERTERS

BACKGROUND OF THE INVENTION

1. Field of the Invention

The present invention relates in general to digital to analogue converters (DAC), and in particular to suppression of transient noise at turn-on of an audio power DAC.

2. Description of the Related Art

Class D audio power amplifiers (APAs) have been used for many years in systems, such as wireline telephony, where high bandwidth is not critical. More recently however, new fabrication techniques, and in particular, new techniques for fabricating power transistors, have made integrated class D APAs possible. This has extended their potential applications to lower-power, higher-bandwidth systems, including battery-powered portable music players and wireless communications devices.

One major advantage of class D amplifiers is their efficiency. Generally, an audio signal is converted into a relatively high frequency stream of pulses varying in width with the amplitude of the audio signal. This pulse width modulated (PWM) signal is used to switch a set of power output transistors between cutoff and saturation which results in efficiencies above ninety percent (90%). In contrast, the typical class AB push-pull amplifier, using output transistors whose conduction varies linearly during each half-cycle, has an efficiency of around sixty percent (60%). The increased efficiency of class D amplifiers in turn reduces power consumption and consequently lowers heat dissipation and improves battery life in portable systems.

As previously described, in a class D amplifier, efficiency is gained by switching the power devices hard between the power supply rails. The high frequency noise is then filtered with a low pass filter. Typically, the low pass filter is of the passive type, including inductive and/or capacitive reactive elements to smooth the signal. FIG. 1 illustrates, in block diagram form, a typical class D amplifier system 100. Amplifier system 100 includes class D amplifier 102 containing MOSFET switch 104 and delta-sigma (ΔΣ) converter/PWM controller 106 receives a digitized audio input signal, which constitutes the signal to be amplified. The digital input signal may be high resolution, low data rate data, which may be converted to low resolution, high data rate data by delta-sigma converter portion of delta-sigma converter/PWM 106. (For example, the digital input signal may be 24-bit, 44 kHz data while the PWM data may be 5-bit, 1.1 MHz data.) MOSFET switch 104 may constitute a full bridge amplifier.

The PWM drives a signal onto an input of MOSFET switch 104. The duty cycle of the PWM signal is proportional to the (quantized) amplitude of the audio signal. In other words, for each sample period, the relative time duration of the "high" and "low" levels of the PWM signal into MOSFET switch 104 are proportional to the quantized amplitude of the audio signal, and consequently the relative time intervals during which the output of the amplifier, ahead of LPF 110, is pulled up and pulled down is similarly proportional to the audio signal amplitude. (PWM signal generation techniques are discussed in the commonly owned U.S. Pat. No. 5,815,102 to Melanson, entitled "Delta-sigma PWM DAC to Reduce Switching," incorporated herein by reference.) The amplified audio is recovered via low pass filter (LPF) 110, which provides the audio output to an audio transducer 124, which may be, for example a speaker or headphones. LPF 110 may be AC coupled to switch 104 through coupling capacitor 108. When system 100 is turned on, coupling capacitor 108 must be charged. During the transient charging of capacitor 108, an audible signal may be produced. This may be perceived as an audible "pop" in transducer 124. Alternatively, DACs using a ramp to charge capacitor 108, may produce audible "rushing" noise in transducer 124 resulting from instability of delta-sigma converter/PWM 106. Thus there is a need for circuits and methods for reducing the audible transient noise in a DAC system having a PWIM drive.

SUMMARY OF THE INVENTION

According to the principles of the present invention, a system is disclosed having a digital signal source and a switched-mode amplifier for amplifying a signal in response to the digital signal source. The system also contains a first complementary metal oxide semiconductor field effect transistor (MOSFET) pair having a common node serially coupled through a resistor to an output node of the amplifier. The first MOSFET pair is configured to receive an input signal, the input signal driving a ramp on the output node of the amplifier.

The inventive concept addresses a problem in systems having switched-mode amplifiers, namely, a transient noise caused at start-up of the system. In accordance with the inventive principles, a ramp is driven on the output node of the amplifier through a series resistor using a complementary MOSFET pair included in the amplifier, such that the transient noise is reduced by the voltage division across the resistor.

BRIEF DESCRIPTION OF THE DRAWINGS

For a more complete understanding of the present invention, and the advantages thereof, reference is now made to the following descriptions taken in conjunction with the accompanying drawings, in which:

FIGS. 3.1 and 3.2 illustrates, in graphical form, initial input signals which may be used with the embodiment in FIG. 2;

FIG. 3.3 illustrates an exemplary signal range and PWM modulation index which may be used in conjunction with an embodiment of the present invention;

DETAILED DESCRIPTION

Figure 1:
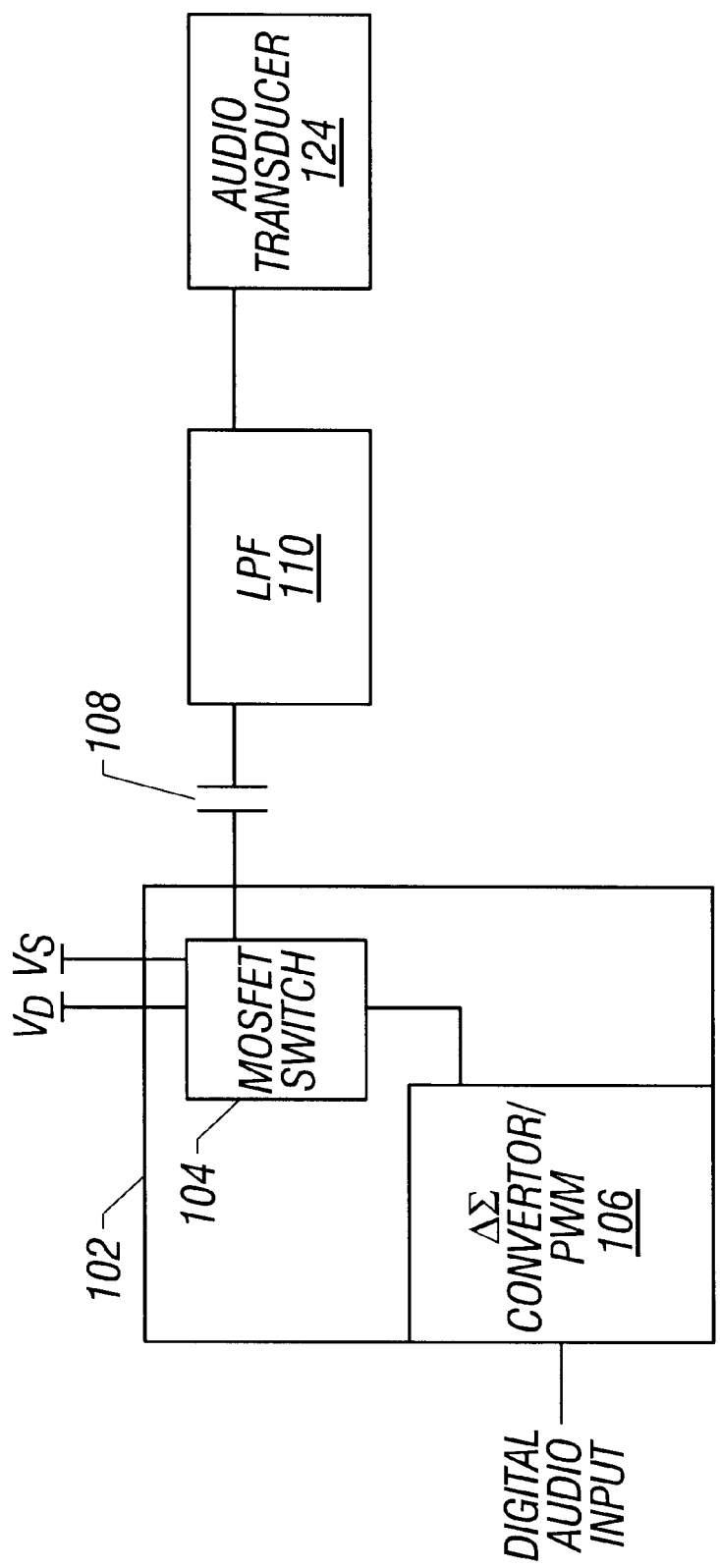
FIG. 1 illustrates, in high-level block diagram form, an amplifier system which may be used with the present invention.

In the following description, numerous specific details are set forth, such as modulation indexes, etc., to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted in as much as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

Figure 2:
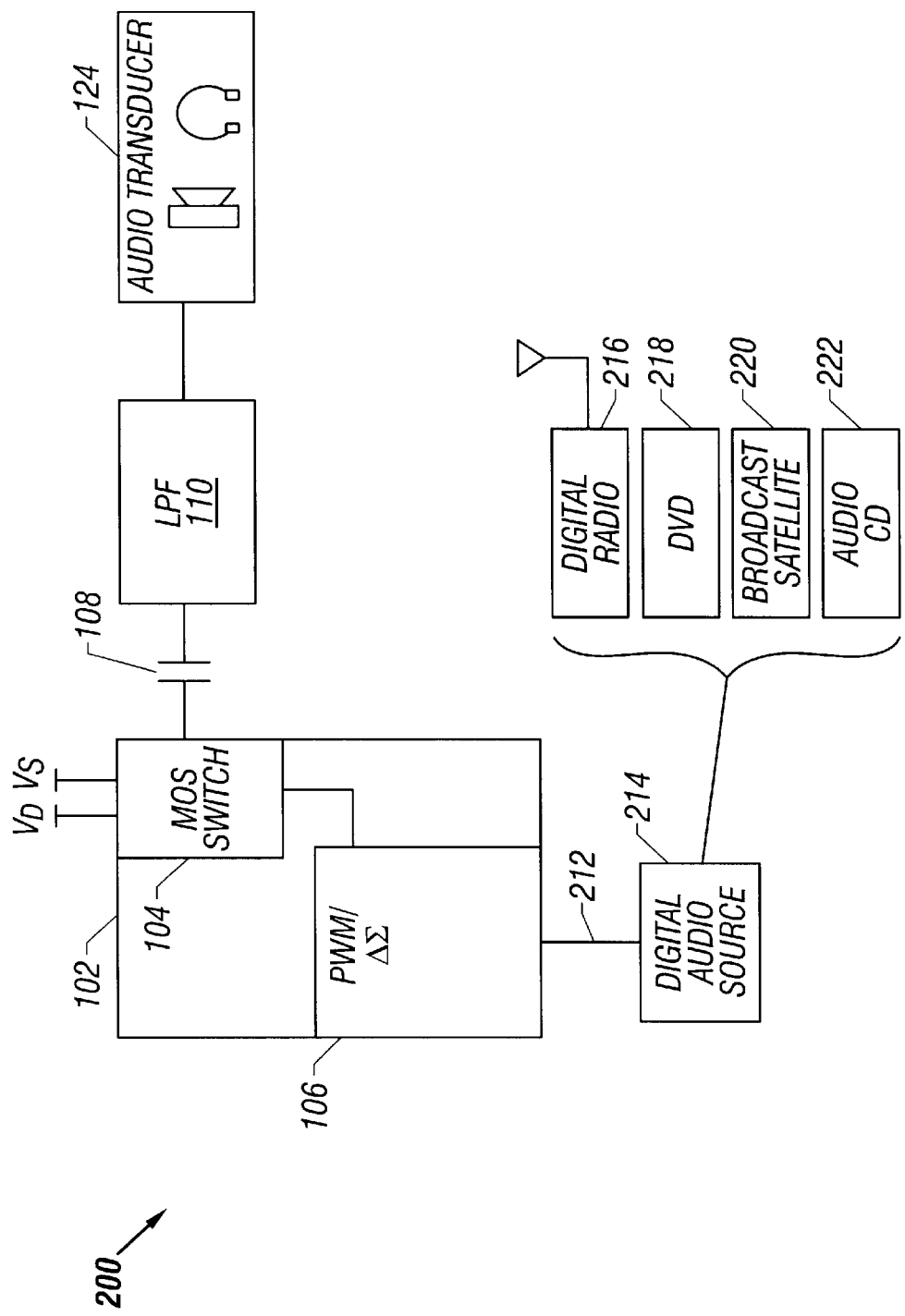
FIG. 2 illustrates, in block diagram form, an audio system in accordance with the principles of the present invention.

Referring first to FIG. 2, there is illustrated an audio system 200 in accordance with the principles of the present invention. System 200 includes amplifier 102, digital audio source 214 and audio transducer 124. Amplifier 102 includes, in addition to switch 104, pulse-width modulator/ delta-sigma converter 106. Switch 104 is coupled to LPF 110 through blocking capacitor 108, and audio transducer 124 is coupled to the output of LPF 110. Digital signal 212 may be a conventional pulse code modulated (PCM) digital representation of an analog signal. Digital signal source 214 may include, for example, one or more of a digital radio 216, digital video disk (DVD) player 218, direct broadcast satellite 220, or audio compact disk (CD) 222. (An ordinarily skilled artisan would understand that other digital signal sources may be used in conjunction with system 200 and such embodiments would fall within the spirit and scope of the present invention.)

In audio amplifier systems employing a conventional PCM DAC, the transient noise, or "pop," associated with the charging of coupling capacitor 108 may be eliminated by driving the amplifier with a ramp prior to applying the input signal. The ramp is applied at initiation of the audio system, and during the application of the ramp the coupling capacitor is charged to approximately one-half of the supply rail. However, ramping the output in a switched-mode amplifier system driven by a delta-sigma converter and PWM, such as amplifier system 200, FIG. 2 does not eliminate transient noise at start-up of the system.

This may be understood by referring now to FIG. 3.1 graphically illustrating an output ramp 300. The system is turned on at $t_0$ and the output ramps in time until the output reaches approximately one-half the supply rail, at time $t_1$. A typical ramp time might be two hundred milliseconds (200 ms).

However, in a switched-mode amplifier system driven by a delta-sigma converter and PWM, the PWM may not be driven to either supply rail, either the lower rail, $V_S$, or the upper supply rail, $V_D$, as the PWM will become unstable. The input signal range, relative to the supply voltage, within which the PWM may be stably operated is referred to as the "modulation index" ("MI"). This is illustrated in FIG. 3.3, showing an exemplary input signal range for a PWM with a modulation index of ninety percent (90%). In such a PWM, the input signal range that may be within the stable operating range of the PWM may be between five percent of $V_D$ and ninety-five percent of $V_D$. It would be recognized by persons of ordinary skill in the art that this modulation index is illustrative, and the principles of the present invention to be discussed do not depend on the particular value of the modulation index. Therefore, systems in accordance with the principles of the present invention having other values for the modulation index would fall within the spirit and scope of the present invention.

Returning to FIG. 3.1, until the input signal driving the ramp reaches the MI of the PWM, the PWM is unstable. This gives rise to noise on the output ramp, noise 302 in FIG. 3.1. When the signal driving the ramp reaches the lower limit of the MI of the PWM, the PWM stabilizes, and the noise on the output ceases, time $t_m$ in FIG. 3.1. The output then stably ramps until reaching approximately half the supply rail, as previously described.

However, the oscillation on the output that occurs until the PWM stabilizes will produce an audible noise, similar to a "rushing" sound, in the audio transducer, a speaker or headphone set for example, until the PWM stabilizes.

Alternatively, instability of the PWM may be avoided by initiating the ramp with the drive operating within the MI of the PWM, as illustrated in FIG. 3.2. Ramp 304 is initiated with a input signal at the lower limit of the stable operating range of the PWM, that is, just within the MI of the PWM. However, this results in a step 306 in ramp 304, which again produces an audible noise in the audio transducer at the initialization of the amplifier system.

Figure 4:
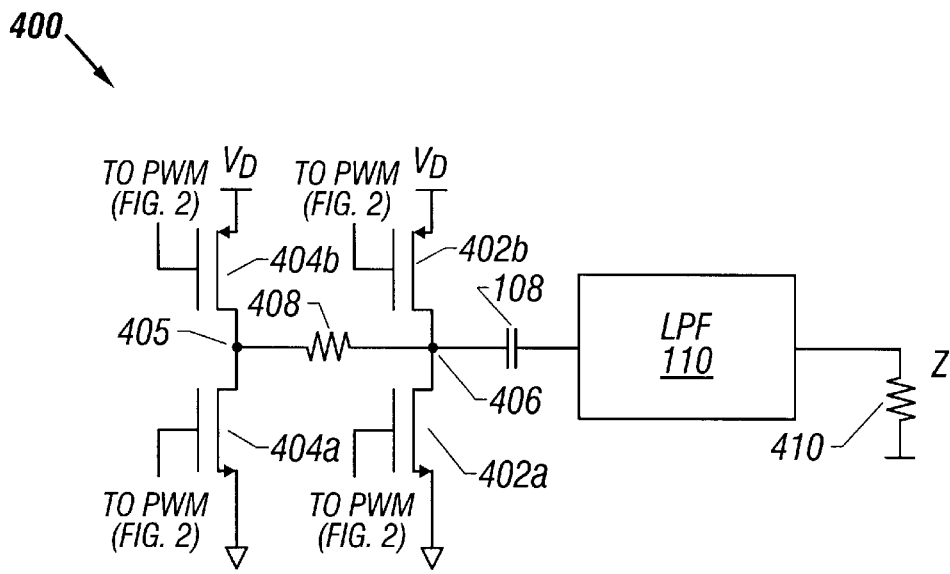
FIG. 4 illustrates, in partial schematic form, a portion of the audio system of FIG. 2.

Refer now to FIG. 4 in which is depicted a portion 400 of switch 104, FIG. 2, in accordance with the principles of the present invention. Transistors 402a and 402b form a complementary pair of metal oxide semiconductor field effect transistors (MOSFETs). These constitute the amplifier switch in portion 400 of MOSFET switch 104.

Additionally, another MOSFET pair, transistors 404a and 404b are provided. The common node 405 of these transistors is coupled to output node 406 through a resistor, resistor 408. Transistors 404a and 404b may collectively be referred to as a "popguard" switch.

During initialization of an amplifier system including portion 400 in accordance with the principles of the present invention, a ramp, such as a ramp 302 in FIG. 3.1, is driven on output node 406 through the popguard switch. The ramp may be driven in accordance with, in one embodiment, FIG. 3.1 in which the input signal driving the ramp initially lies outside the MI of the PWM, whereby the PWM is initially unstable. However, the noise due to oscillation of the PWM is suppressed at the output by the division ration of the voltage divider formed by resistor 408 in the impedance 410 of the audio transducer. An exemplary value for resistor 408 may be 600 ohms (600 Ω). Typical values for the impedance of an audio transducer such as a speaker or headphones may be 16 ohms (16 Ω), with a typical range of from 2 ohms to 16 ohms (2–16 Ω). Thus, in this exemplary embodiment, the output noise due to the oscillation of the PWM may be reduced by approximately 97 percent to unobjectionable levels. An artisan of ordinary skill in the art would recognize that other values for resistor 408 may be used in alternative embodiments of an amplifier system in accordance with the principles of the present invention and such alternative embodiments would fall within the spirit and scope of the invention.

Similarly, in another alternative embodiment, a ramp having an initial step, such as ramp 304 in FIG. 3.2, may be driven via popguard switch transistors 404A and 404B. In the same fashion as discussed in conjunction with the noise due to the PWM oscillation hereinabove, the transient "pop" associated with the step is reduced by the division ratio of the voltage divider formed by resistor 408 and impedance 410 representing the load impedance of the audio transducer. It would be appreciated by one of ordinary skill in the art that ramps 300, FIG. 3.1, and 304, FIG. 3.2 are illustrative and ramps having other temporal profiles may be used in the present invention. In particular, it would be recognized that the ramp need not be linear. The use of such ramps in conjunction with the present invention would fall within the spirit and scope of the invention.

Note that transistors 404a and 404b may be sized smaller than amplifier transistors 402a and 402b. Because popguard switch transistors 404a and 404b drive output node 406 via resistor 408, the source impedance of the popguard switch may be dominated by resistor 408, provided that the size of transistors 404a and 404b are such that the channel resistance of these transistors is smaller than the resistance of resistor 408.

At the end of the ramp, (time $t_1$ in FIGS. 3.1 and 3.2) the coupling capacitor, such as capacitor 108 in FIG. 4, is charged to approximately one-half of the supply rail, and the digital PWM output (which may be derived from a digital audio signal, for example) can now be driven on the amplifier switch, transistors 402a and 402b. Popguard switch transistors 404a and 404b may be held in a high impedance state. (This may also be referred to as "tristating" transistors 404a and 404b.) Alternatively, the digital audio PWM signal may be simultaneously driven on amplifier transistors 402a and 402b, and popguard switch 404a and 404b, which, in this instance, because of the size of the popguard transistors or the presence of resistor 408, or both, the driving of output node 406 is swamped by the amplifier switch, transistors 402a and 402b.

Figure 5:
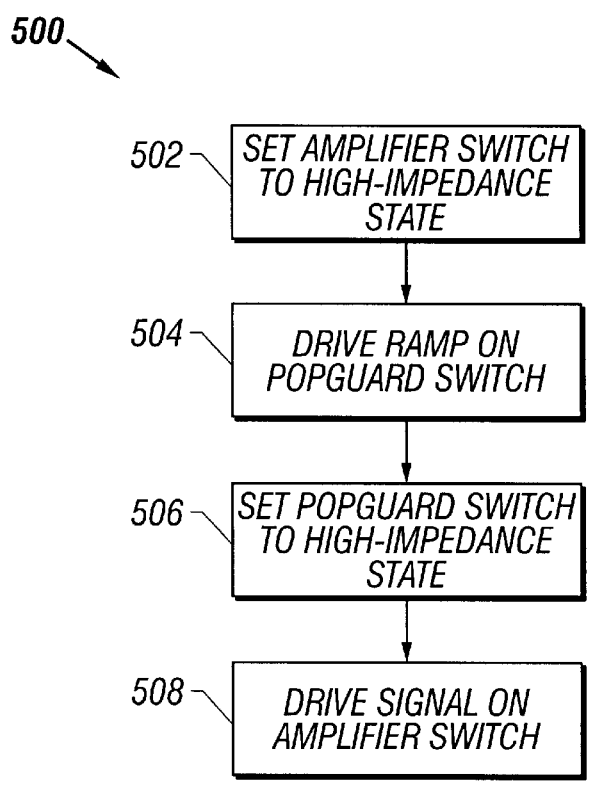
FIG. 5 illustrates, in flow chart form, a methodology in accordance with an embodiment of the present invention.

The operation of the switch mode amplifier, such as amplifier 102, FIG. 2, in accordance with the principles of the present invention illustrated by methodology 500 in FIG. 5. In step 502, the amplifier switch, transistors 402a and 402b in FIG. 4, are set to a high impedance state. (This may also be referred to as tristating transistors 402a and 402b.) In step 504, a ramp is driven on the popguard switch, transistors 404a and 404b, FIG. 4. At the end of the ramp, in step 506, the popguard switch is set to a high impedance state, and in step 508, the audio signal is driven on the amplifier switch, transistors 402a and 402b in FIG. 4. As previously noted, in an alternative embodiment, step 506 may be omitted, and in step 508 the digital PWM signal is driven both on the amplifier switch and the popguard switch, transistors 404a and 404b.

Although the invention has been described with reference to specific embodiments, these descriptions are not meant to be construed in a limiting sense. Various modifications of the disclosed embodiments, as well as alternative embodiments of the invention, will become apparent to persons skilled in the art upon reference to the description of the invention. It should be appreciated by those skilled in the art that the conception and the specific embodiment disclosed may be readily used as a basis for modifying or designing other structures for carrying out the same purposes of the present invention. It should also be realized by those skilled in the art that such equivalent constructions do not depart from the spirit and scope of the invention as set forth in the appended claims.

It is therefore contemplated that the claims will cover any such modifications or embodiments that fall within the true scope of the invention.

What is claimed:

1. A system comprising:
    a digital signal source;
    a switched-mode power amplifier coupled to said digital signal source, said amplifier providing an amplified signal on an output node of said amplifier in response to said digital signal source, said amplifier including: a first complementary MOSFET pair having a common node serially coupled to an output node of said amplifier through a resistor, wherein said first complementary transistor pair is configured to drive a ramp on said output node of said amplifier.

2. The system of claim 1 further comprising a driver, said driver configured for outputting a first signal to said first complementary MOSFET pair, said first complementary MOSFET pair driving said ramp in response to said first signal.

3. The system of claim 2 wherein said driver further includes circuitry configured to provide a second signal to said first complementary MOSFET pair for placing said first complementary MOSFET pair in a high impedance state.

4. The system of claim 2 wherein said driver further includes circuitry configured to provide a digital drive signal to a second complementary MOSFET pair signal in response to said digital signal source, said second complementary MOSFET pair outputting said amplified signal in response to said digital drive signal.

5. The system of claim 4 wherein said driver further includes circuitry configured to provide said digital drive signal to said first complementary MOSFET pair.

6. The system of claim 2 wherein said driver comprises a pulse-width modulator (PWM).

7. The system of claim 4 wherein said driver further includes circuitry configured to provide a signal to said second complementary MOSFET pair for placing said second complementary MOSFET pair in a high impedance state.

8. The system of claim 1 wherein said digital audio signal comprises a digital audio source.

9. A transient noise reduction apparatus comprising:
    a first complementary metal oxide semiconductor field effect transistor (MOSFET) pair having a common node serially coupled to an output node of a switched-mode power amplifier through a resistor, wherein said first complementary transistor pair is configured to receive an first input signal, said first input signal driving a ramp on said output node of said amplifier; and
    a driver, said driver configured for outputting said first signal to said first complementary MOSFET pair.

10. The apparatus of claim 9 wherein said driver includes circuitry configured to provide a digital drive signal to a second complementary MOSFET pair having a common node coupled to said output node of said switched-mode amplifier.

11. The apparatus of claim 10 wherein said driver comprises a pulse-width modulator.

12. The apparatus of claim 10 wherein said driver further includes circuitry configured to provide a second input signal to said first complementary MOSFET pair for placing said first complementary MOSFET pair in a high impedance state.

13. The apparatus of claim 10 wherein said driver includes further includes circuitry configured to provide said digital drive signal to said first complementary MOSFET pair.

14. The apparatus of claim 10 wherein said driver further includes circuitry configured to provide a signal to said second complementary MOSFET pair for placing said second complementary MOSFET pair in a high impedance state.

15. A transient noise suppression method comprising the steps of:
    providing a first input signal to a first complementary metal oxide semiconductor field effect transistor (MOSFET) pair; and
    driving, in response to said first input signal, a voltage ramp on an output node of a switched-mode power amplifier serially coupled, through a resistor, to a common node of said first complementary MOSFET pair.

16. The method of claim 15 further comprising the step of setting a second complementary MOSFET pair having a common node coupled to said output node of said amplifier in a high impedance state.

17. The method of claim 16 further comprising the step of amplifying a digital drive signal using said second complementary MOSFET pair.

18. The method of claim 17 wherein said digital drive signal is derived from a digital audio source.

19. The method of claim 16 further comprising the step of setting said first complementary MOSFET pair in a high impedance state.

20. The method of claim 17 further comprising the step of providing said digital drive signal to said first complementary MOSFET pair.

21. The system of claim 1 wherein a division ratio of the resistor and an impedance of a load has a value sufficient to reduce startup noise to an unobjectionable level.

22. The apparatus of claim 9 wherein a division ratio of the resistor and an impedance of a load has a value sufficient to reduce startup noise to an unobjectionable level.

23. The method of claim 15 wherein a division ratio of the resistor and an impedance of a load has a value sufficient to reduce startup noise to an unobjectionable level.

24. The system of claim 1 wherein said ramp charges a capacitor serially coupled between said output node and a load.

25. The apparatus of claim 9 wherein said ramp charges a capacitor serially coupled between said output node and a load.

26. The method of claim 15 wherein said ramp charges a capacitor serially coupled between said output node and a load.

27. The system of claim 1 wherein the ramp and the resistor operate in combination to reduce a startup click transient to an imperceptible level.

28. The apparatus of claim 9 wherein the ramp and the resistor operate in combination to reduce a startup click transient to an imperceptible level.

29. The method of claim 15 wherein the ramp and the resistor operate in combination to reduce a startup click transient to an imperceptible level.

30. The system of claim 4 wherein a value of said resistor is at least about 1000 times a resistance of each MOSFET of the second MOSFET pair.

31. The apparatus of claim 10 wherein a value of said resistor is at least about 1000 times a resistance of each MOSFET of the second MOSFET pair.

32. The method of claim 17 wherein a value of said resistor is at least about 1000 times a resistance of each MOSFET of the second MOSFET pair.

33. The system of claim 24 wherein a time constant of the resistor and capacitor is equal to or greater than about one millisecond.

34. The apparatus of claim 25 wherein a time constant of the resistor and capacitor is equal to or greater than about one millisecond.

35. The system of claim 26 wherein a time constant of the resistor and capacitor is equal to or greater than about one millisecond.

* * * * *